(12) United States Patent
Yeh et al.

(10) Patent No.: US 10,103,108 B2
(45) Date of Patent: Oct. 16, 2018

(54) NANOSTRUCTURED CHIP AND METHOD OF PRODUCING THE SAME

(71) Applicant: GLOBALWAFERS CO., LTD., Hsinchu Science Park (TW)

(72) Inventors: Jer-Liang Yeh, Hsinchu Science Park (TW); Chih-Yuan Chuang, Hsinchu Science Park (TW); Chun-I Fan, Hsinchu Science Park (TW); Chien-Jen Sun, Hsinchu Science Park (TW); Ying-Ru Shih, Hsinchu Science Park (TW); Wen-Ching Hsu, Hsinchu Science Park (TW)

(73) Assignee: GLOBALWAFERS CO., LTD., Hsinchu Science Park (TW)

( * ) Notice: Subject to any disclaimer, the term of this patent is extended or adjusted under 35 U.S.C. 154(b) by 4 days.

(21) Appl. No.: 15/080,488

(22) Filed: Mar. 24, 2016

(65) Prior Publication Data

US 2016/0284649 A1   Sep. 29, 2016

(30) Foreign Application Priority Data

Mar. 26, 2015  (TW) .............................. 104109727 A
Sep. 8, 2015   (TW) .............................. 104129684 A

(51) Int. Cl.
*H01L 23/00* (2006.01)
*H01L 21/306* (2006.01)
(Continued)

(52) U.S. Cl.
CPC ........ *H01L 23/562* (2013.01); *H01L 21/0243* (2013.01); *H01L 21/0254* (2013.01);
(Continued)

(58) Field of Classification Search
CPC .. G01C 21/165; G05D 1/0278; G05D 1/0274; H01L 29/0661; H01L 29/7325;
(Continued)

(56) References Cited

U.S. PATENT DOCUMENTS 9,304,035 B2 *  4/2016  Wober .................. B82Y 20/00
9,343,490 B2 *  5/2016  Yu ..................... H01L 27/14621
(Continued)

FOREIGN PATENT DOCUMENTS

JP      H07273025 A    10/1995
JP      20022511831 A   4/2002
(Continued)

OTHER PUBLICATIONS

English language abstract of TW 515780.
(Continued)

*Primary Examiner* — Julio J Maldonado
*Assistant Examiner* — Stanetta Isaac
(74) *Attorney, Agent, or Firm* — Lynette Wylie; Apex Juris, pllc.

(57) ABSTRACT

A nanostructured chip includes a substrate and a nanostructured layer, wherein the substrate has a first surface and a second surface on which the nanostructured layer is formed. A method of producing the nanostructured chip includes the step of forming the nanostructured layer on the second surface of the substrate. Whereby, the nanostructured layer effectively disperses a stress to increase the flexural strength of the nanostructured chip. Therefore, during the subsequent procedures to form an epitaxial layer on the first surface, the nanostructured layer is helpful to prevent the epitaxial layer from generating cracks, and prevent the substrate from bowings, or fragments.

8 Claims, 11 Drawing Sheets

(51) Int. Cl.
*H01L 29/06* (2006.01)
*H01L 21/02* (2006.01)
*H01L 29/20* (2006.01)

(52) U.S. Cl.
CPC .. *H01L 21/02381* (2013.01); *H01L 21/02458* (2013.01); *H01L 21/02658* (2013.01); *H01L 21/30604* (2013.01); *H01L 29/0657* (2013.01); *H01L 29/0676* (2013.01); *H01L 29/2003* (2013.01)

(58) Field of Classification Search
CPC ............. H01L 29/8613; H01L 29/0665; H01L 29/0669; H01L 29/673; H01L 51/4266; H01L 51/502; B81C 2201/0187; B82B 3/0061; B82B 3/0066
See application file for complete search history.

(56) References Cited

U.S. PATENT DOCUMENTS

| | | | | |
|---|---|---|---|---|
| 9,478,685 | B2* | 10/2016 | Yu | ........................ H01L 27/1443 |
| 9,515,218 | B2* | 12/2016 | Yu | ........................ H01L 31/03529 |
| 2002/0104671 | A1* | 8/2002 | Akio | ................. H01L 23/49822 174/528 |
| 2014/0252314 | A1* | 9/2014 | Yu | ......................... B82Y 15/00 257/21 |

FOREIGN PATENT DOCUMENTS

| | | |
|---|---|---|
| JP | 2007297223 A | 11/2007 |
| JP | 2013510433 A | 3/2013 |
| JP | 2015032789 A | 2/2015 |
| TW | 201138146 A | 11/2011 |
| TW | 201210068 A | 3/2012 |
| TW | 201244068 A | 11/2012 |
| TW | 201408584 A | 3/2014 |
| TW | 473283 | 2/2015 |
| TW | 510682 | 12/2015 |
| TW | 515780 | 1/2016 |

OTHER PUBLICATIONS

English language abstract of TW 473283.
English language abstract of TW 510682.
English language abstract of TW 514614.
Examination Report for TW104129684, dated Oct. 4, 2016, total of 5 pages.
Search Report for TW104129684, dated Sep. 26, 2016, total of 1 page.
Examination Report for JP2016045201 dated Feb. 27, 2017, total of 2 pages.
Abstract of JP2002511831, total of 1 page.
Abstract of JP2007297223, total of 1 page.
Abstract of JP2013510433, total of 1 page.
Abstract of JP2015032789, total of 1 page.
Abstract of JPH07273025, total of 1 page.

* cited by examiner

NANOSTRUCTURED CHIP AND METHOD OF PRODUCING THE SAME

BACKGROUND OF THE INVENTION

1. Technical Field

The present invention relates generally to chip production, and more particularly to a nanostructured chip and a method of producing the nanostructured chip.

2. Description of Related Art

In a conventional manufacturing process of a wafer, an epitaxial layer is formed on a surface of a substrate in advance, and is then processed to form particular structures or circuits.

However, if the material of the substrate is different from that of the epitaxial layer (e.g., a silicon substrate with a gallium nitride (GaN) epitaxial layer formed thereon), a stress tends to be generated in the wafer during a cooling process due to the different thermal expansion coefficients between the substrate and the epitaxial layer. Consequently, the epitaxial layer might have cracks or bowings because the silicon substrate is too brittle to eliminate the stress, which may lead to a low yield in the subsequent processing procedures and even wafer fragmentation. Additionally, if the lattice constants of the substrate and the epitaxial layer are mismatched, a stress could be also generated in the wafer, which may cause cracks or bowings in the epitaxial layer or wafer fragmentation as well.

BRIEF SUMMARY OF THE INVENTION

In view of the above, the primary objective of the present invention is to provide a nanostructured chip and a method of producing the nanostructured chip which disperses the stress in the nanostructured chip to increase the flexural strength thereof.

The present invention provides a nanostructured chip, which is adapted to have an epitaxial layer formed thereon, including a substrate and a nanostructured layer. The substrate has a first surface and a second surface opposite to the first surface, wherein the nanostructured chip is adapted to have the epitaxial layer formed on the first surface. The nanostructured layer is formed on the second surface.

The present invention further provides a method of producing a nanostructured chip, which is adapted to have an epitaxial layer formed thereon, including the steps of providing a substrate and forming a nanostructured layer. The substrate has a first surface and a second surface opposite to the first surface. The nanostructured layer is formed on the second surface of the substrate to form the nanostructured chip. In this sense, the nanostructured chip is adapted to have the epitaxial layer formed on the first surface.

Whereby, the nanostructured layer effectively disperses the stress in the nanostructured chip to increase the flexural strength of the nanostructured chip, which prevents the epitaxial layer from having cracks, bowings, or fragments in the following process.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
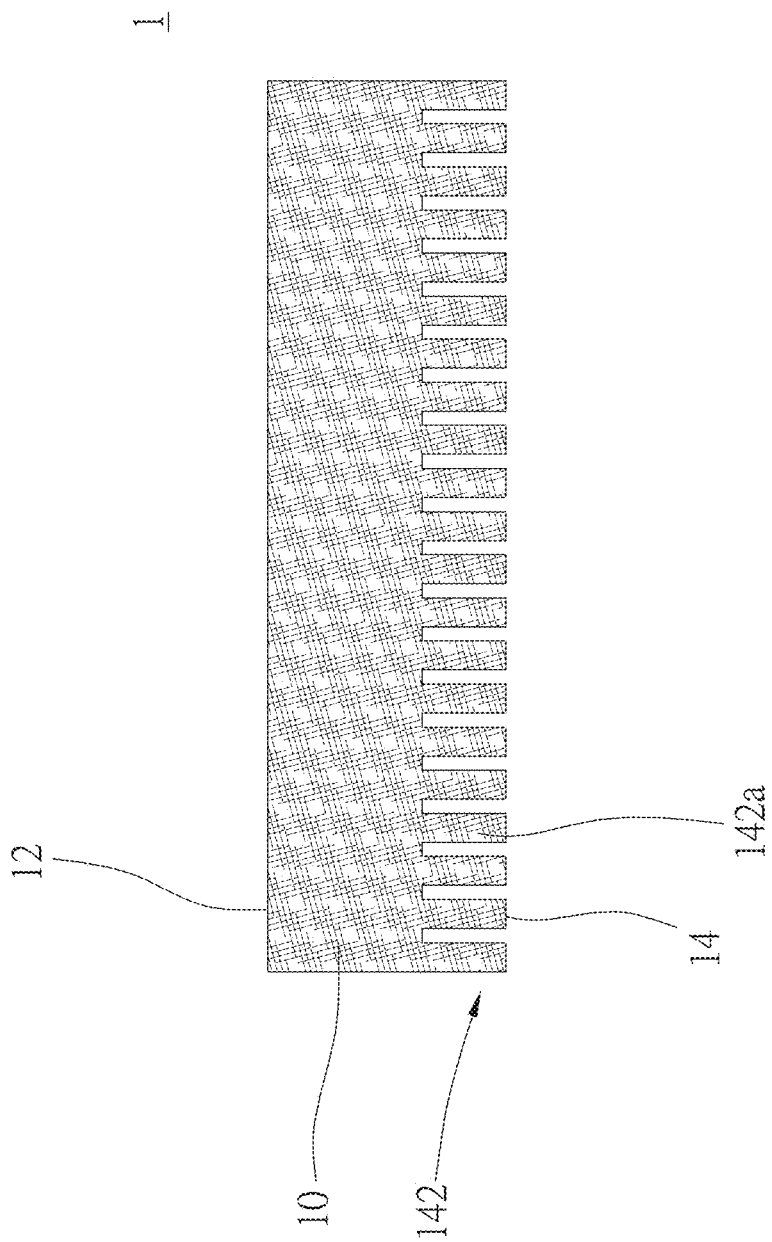
FIG. 1 is a schematic diagram of a first preferred embodiment of the present invention, showing the nanostructured chip.
Figure 2:
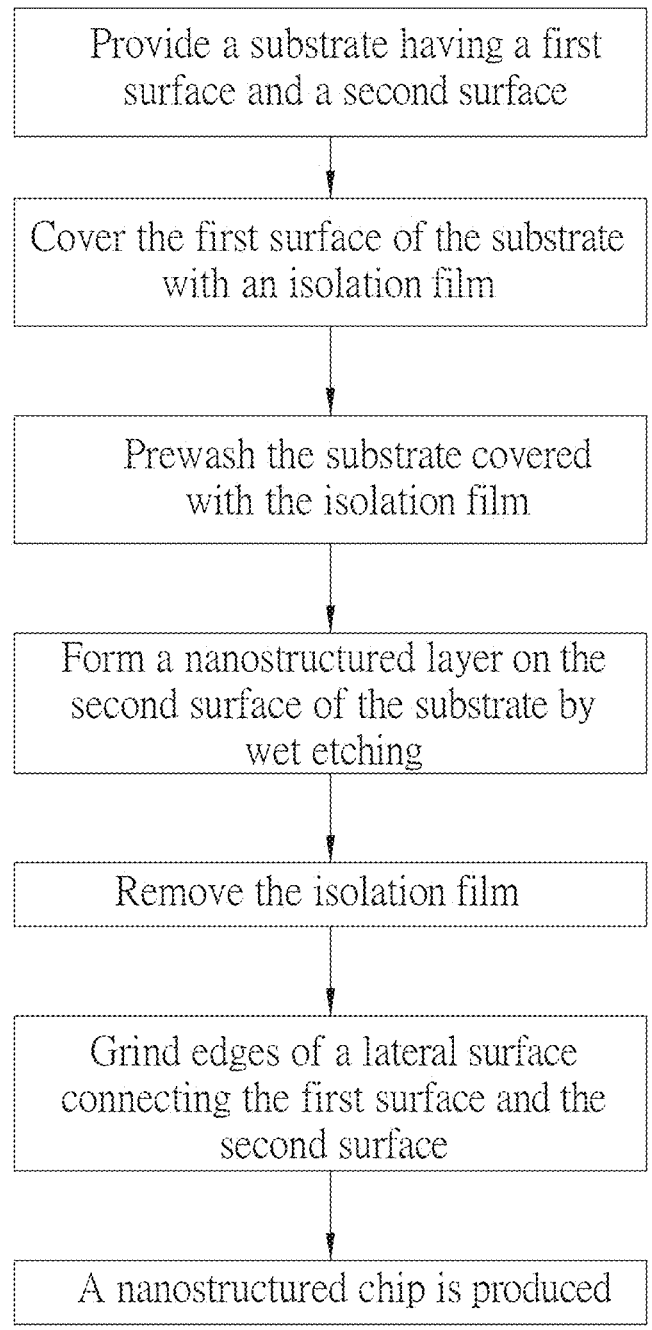
FIG. 2 is a flow chart of the method of producing the first preferred embodiment.

A nanostructured chip 1 shown in FIG. 1 is produced by a method shown in FIG. 2 including steps below.

Provide a substrate 10 having a first surface 12 and a second surface 14 which is opposite to the first surface 12. In the first preferred embodiment, the substrate 10 is a silicon substrate.

Cover the first surface 12 of the substrate 10 with a protective layer which is an isolation film in the first preferred embodiment.

Prewash the substrate 10 covered with the isolation film to the second surface 14 of the substrate 10 clean.

Figure 3:
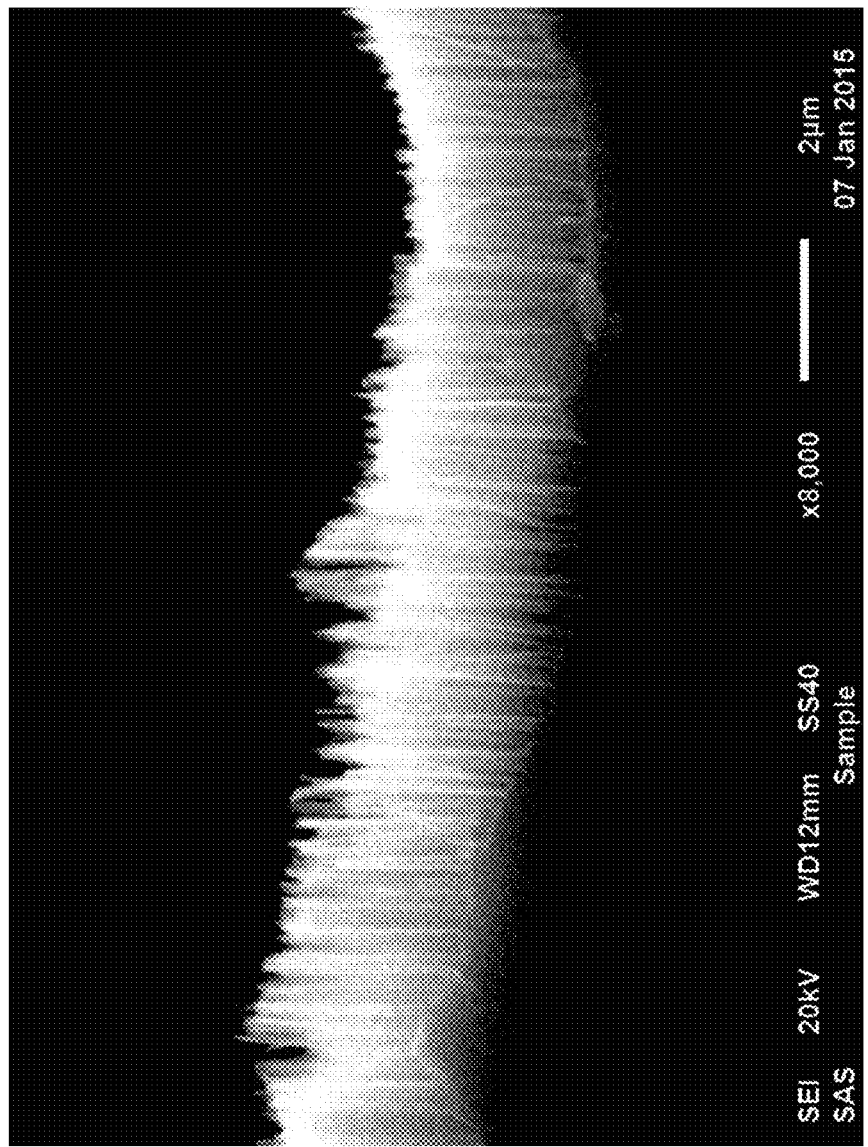
FIG. 3 is a scanning electron microscopic image of the first preferred embodiment, showing the nanostructured layer.

Form a nanostructured layer 142 on the second surface 14 by wet etching. In the first preferred embodiment, the substrate 10 is soaked in etching agent composed of hydrofluoric acid (HF), water, and silver nitrate (AgNO3) at a ratio of 1:4:1 for 40 minutes to form the nanostructured layer 142 including a plurality of nanopillars 142a which are illustrated in FIG. 3.

Remove the isolation film and wash the substrate, and next, grind edges of a lateral surface connecting the first surface 12 and the second surface 14 of the substrate 10 to smooth the lateral surface, and to leave the nanostructured layer 142 on the second surface 14. After the steps abovementioned, the nanostructured chip 1 is produced. In practice, the lateral surface of the substrate 10 could be covered with the isolation film, and has no need to proceed an edge grinding.

Axes of the nanopillars 142a of the nanostructured layer 142 are in parallel in the first preferred embodiment. However, in another embodiment, the axes of the nanopillars 142a are not in parallel. In additional, the nanopillars 142a cover the total area of the second surface 14 in the first preferred embodiment. Practically, the nanopillars 142a cover more than 50% of the total area of the second surface 14. The length of each of the nanopillars 142a is between 10 and 10000 nm, and the width of that is also between 10 and 10000 nm, wherein the length is not less than 4000 nm, and the width is less than 500 nm in the first preferred embodiment.

Figure 4:
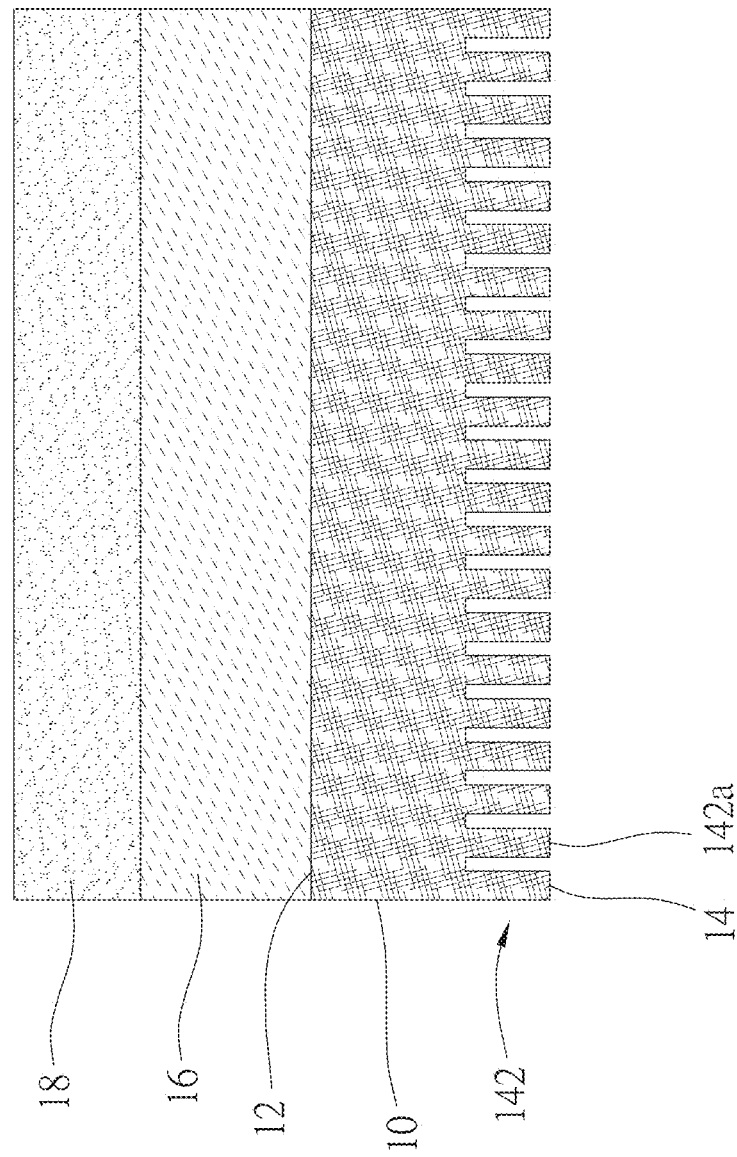
FIG. 4 is a schematic diagram of the first preferred embodiment, showing the buffer layer and the epitaxial layer are formed on the nanostructured chip.

Finally, flat the first surface 12, wash and dry the nanostructured chip 1, and then provide a buffer layer 16 and an epitaxial layer 18 on the first surface 12 depicted in FIG. 4, wherein the buffer layer 16 is made of Aluminum nitride (AlN), and the epitaxial layer 18 is made of gallium nitride (GaN).

The nanostructured layer 142 is helpful to disperse a stress which is generated due to the different thermal expansion coefficients between the epitaxial layer 18 and the nanostructured chip 1 to prevent the epitaxial layer 18 from having cracks, bowings, or fragments in the following process.

Figure 5:
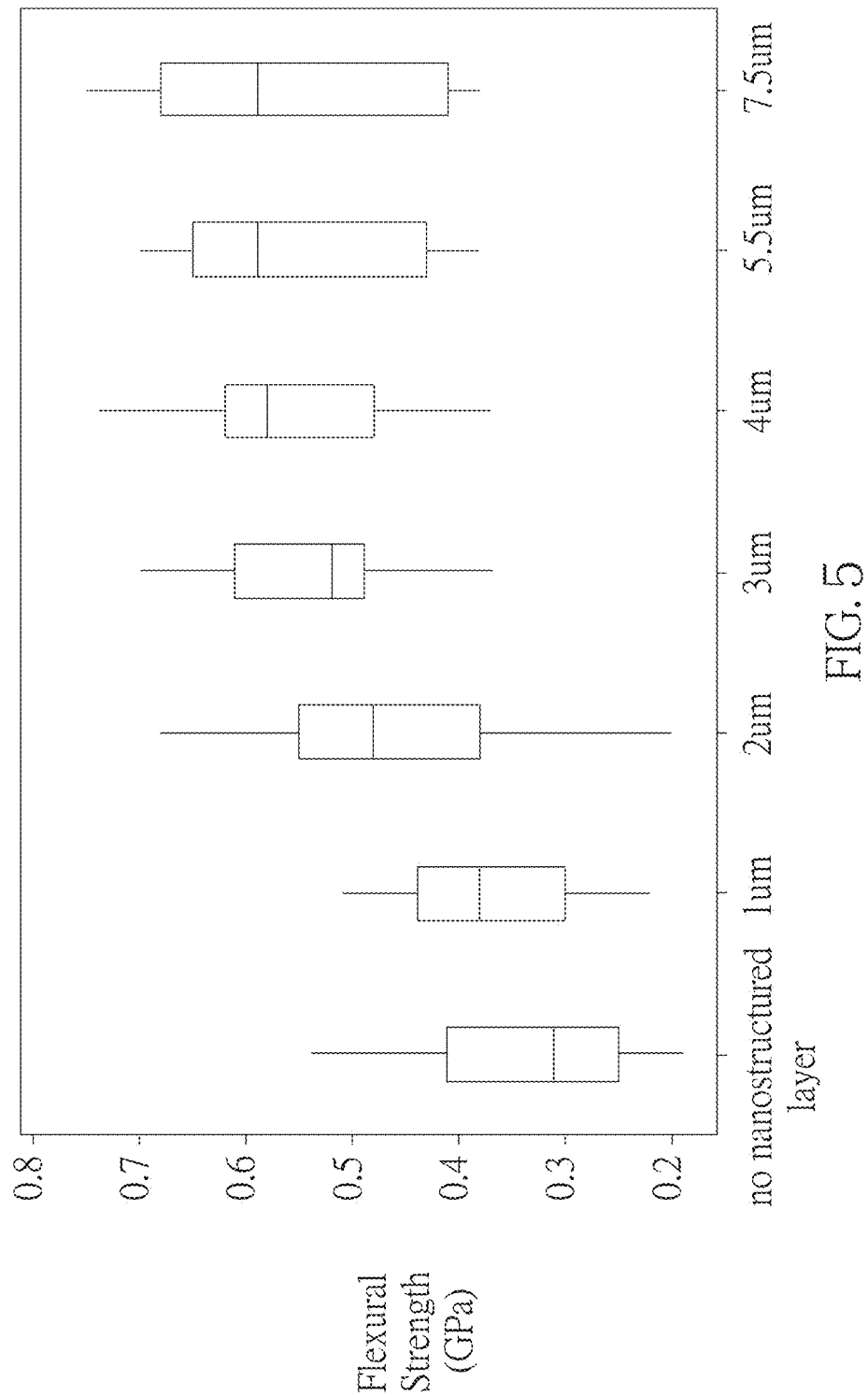
FIG. 5 is a comparison chart of flexural strength of the first preferred embodiment, showing the flexural strength of the nanostructured chips with different length of the nanopillars thereof.

Corresponding to Table 1 below, FIG. 5 shows the flexural strength of the substrate without the nanostructured layer and the nanostructured chips with different length of the nanopillars thereof, wherein the width of the nanopillars 142a is less than 500 nm. According to Table 1 and FIG. 5, the length of the nanopillars 142a is proportional to the flexural strength. If the length of the nanopillars 142a is 3 μm (3000 nm), the average flexural strength is 0.535 Gpa, while the 4 μm (4000 nm), the average flexural strength is raised to 0.557 Gpa. In light of this, if the length of the nanopillars 142a is greater than 4000 nm, the flexural strength of the nanostructured chip 1 would be higher.

TABLE 1

Comparison chart of flexural strength of the substrate without the nanostructured layer and the nanostructured chips with different length of the nanopillars thereof

| | | length of the nanopillars (μm) | | | | | |
|---|---|---|---|---|---|---|---|
| | no nanostructured layer | 1 | 2 | 3 | 4 | 5.5 | 7.5 |
| average flexural strength (GPa) | 0.331 | 0.367 | 0.458 | 0.535 | 0.557 | 0.551 | 0.561 |
| standard deviation | 0.102 | 0.085 | 0.129 | 0.111 | 0.106 | 0.107 | 0.124 |

Figure 6:
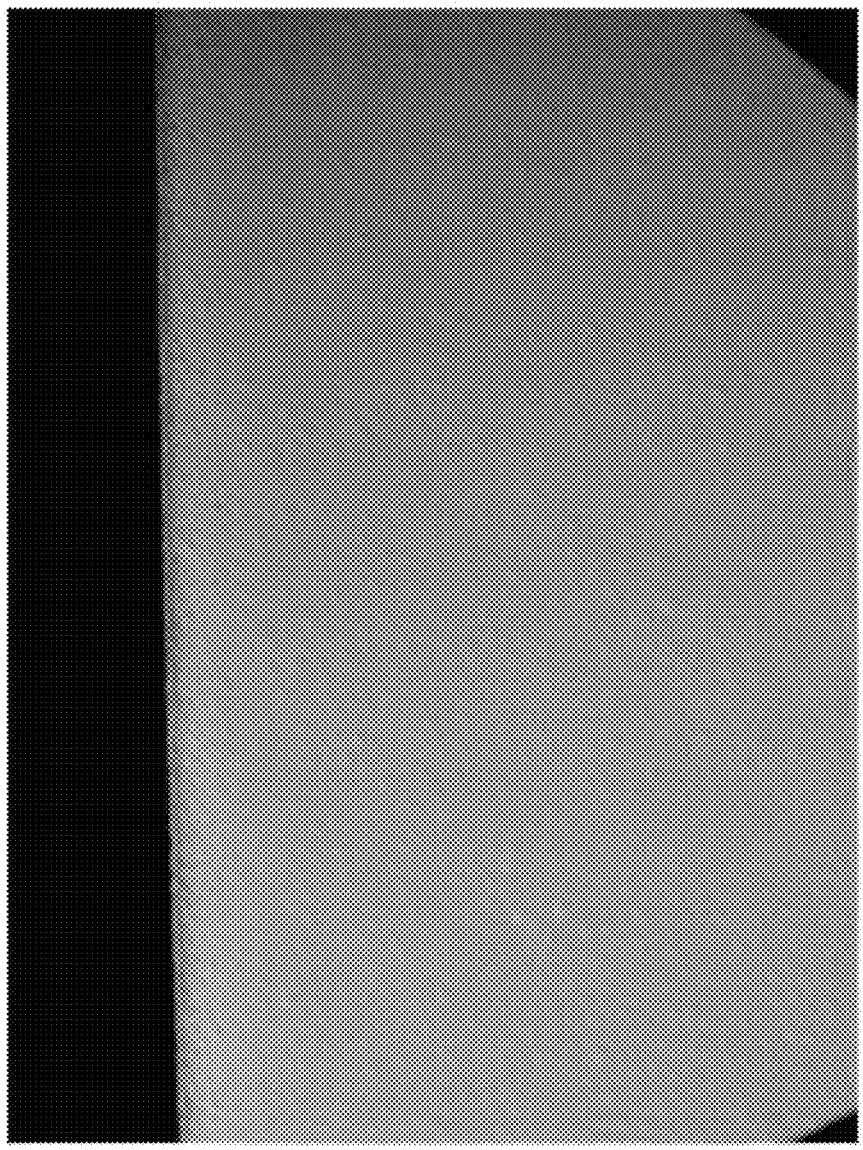
FIG. 6 is a microscopic image of the epitaxial layer formed on the first preferred embodiment.

As shown in FIG. 6, the surface of the epitaxial layer 18 has no cracks.

Figure 7:
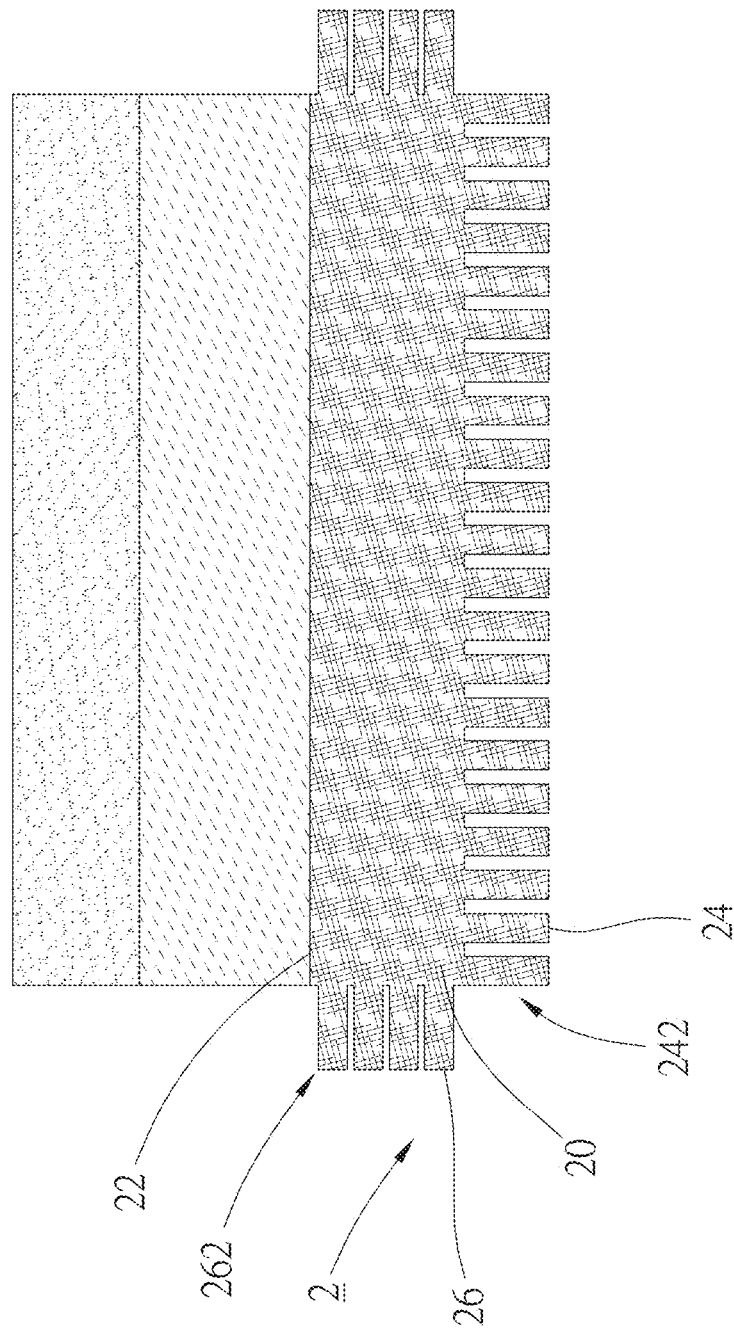
FIG. 7 is a schematic diagram of a second preferred embodiment, showing the buffer layer and the epitaxial layer are formed on the nanostructured chip.
Figure 8:
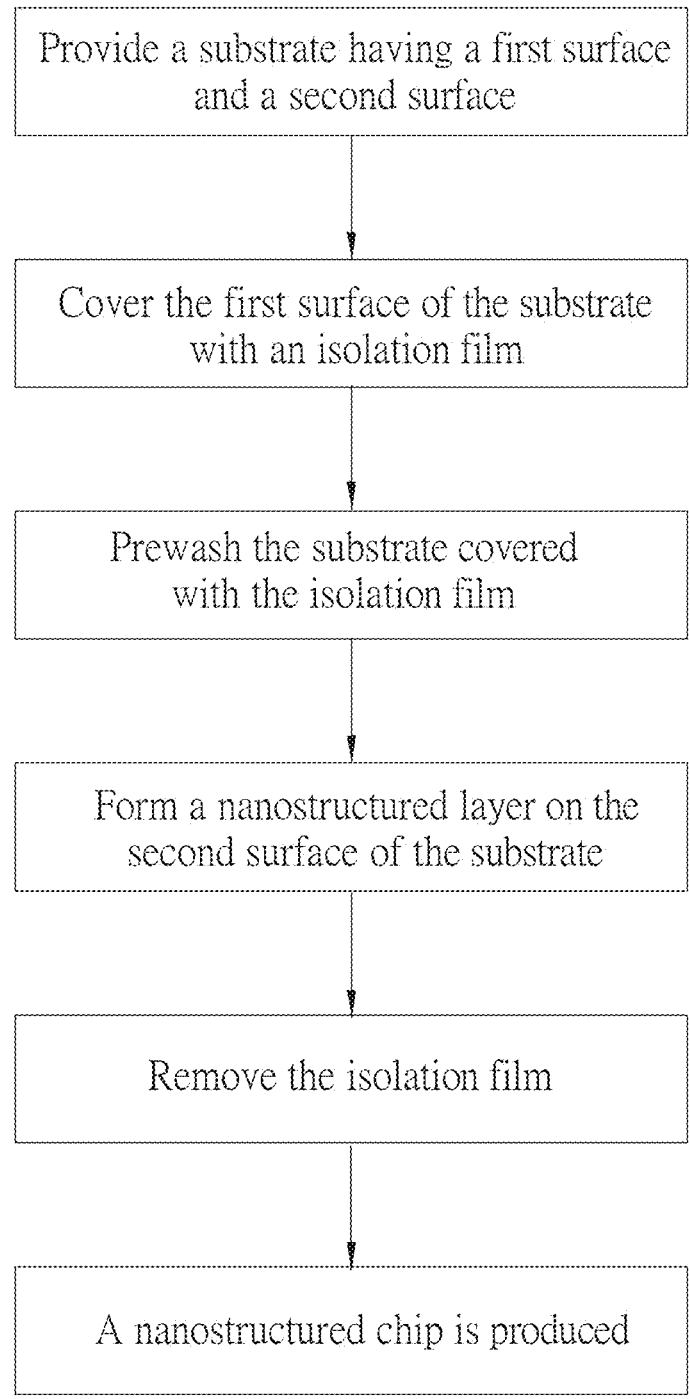
FIG. 8 is a flow chart of the method of producing the second preferred embodiment.

Under a three-point bending test, the nanostructured chip 1 is cracked under a 120 N force, wherein the force causes an overall fragmentation, while the substrate without the nanostructured layer is cracked under mere a 20 N force, wherein the cracks are formed in regions where the stresses are accumulated. In this sense, the nanostructured layer 142 of the nanostructured chip 1 is helpful to disperse the stress A nanostructured chip 2 shown in FIG. 7 is produced by a method shown in FIG. 8, wherein the difference between the first and the second preferred embodiment is that the method for producing the nanostructured chip 2 omits the step of grinding edges of the lateral surface. Therefore, except for the nanostructured layer 242 formed on the second surface 24, another nanostructured layer 262 is also formed on the lateral surface 26 of the substrate 20 which connects the first surface 22 and the second surface 24. Whereby, the two nanostructured layers 242 and 262 formed on the second surface 24 and the lateral surface 26 are more helpful to disperse a stress which is generated after a combination of the epitaxial layer 18 and the nanostructured chip 2.

Figure 9:
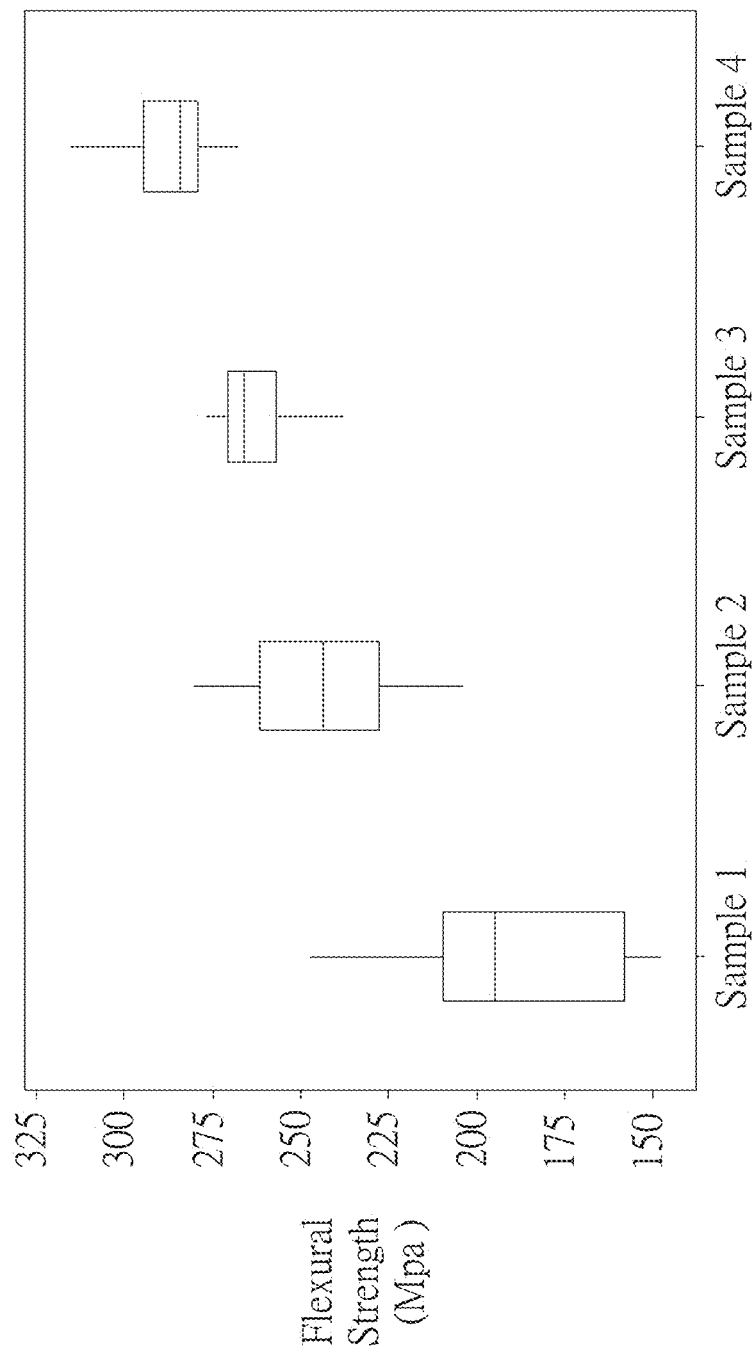
FIG. 9 is a comparison chart of flexural strength of different preferred embodiments.

Corresponding to Table 2 below, FIG. 9 shows the flexural strength of different samples, wherein sample 1 is the substrate without the nanostructured layer, and sample 2 is the substrate with the nanostructured layer formed on the lateral surface; sample 3 and 4 are the first and second preferred embodiments respectively. As shown in FIG. 9, the first and second preferred embodiments have higher flexural strength.

TABLE 2

Comparison chart of flexural strength of the substrate without the nanostructured layer and the nanostructured chips with nanopillars on different regions

| | Sample 1 | Sample 2 | Sample 3 | Sample 4 |
|---|---|---|---|---|
| average flexural strength (MPa) | 188.45 | 241.25 | 265.29 | 286.81 |
| standard deviation | 28.09 | 24.20 | 16.23 | 9.11 |

Figure 10:
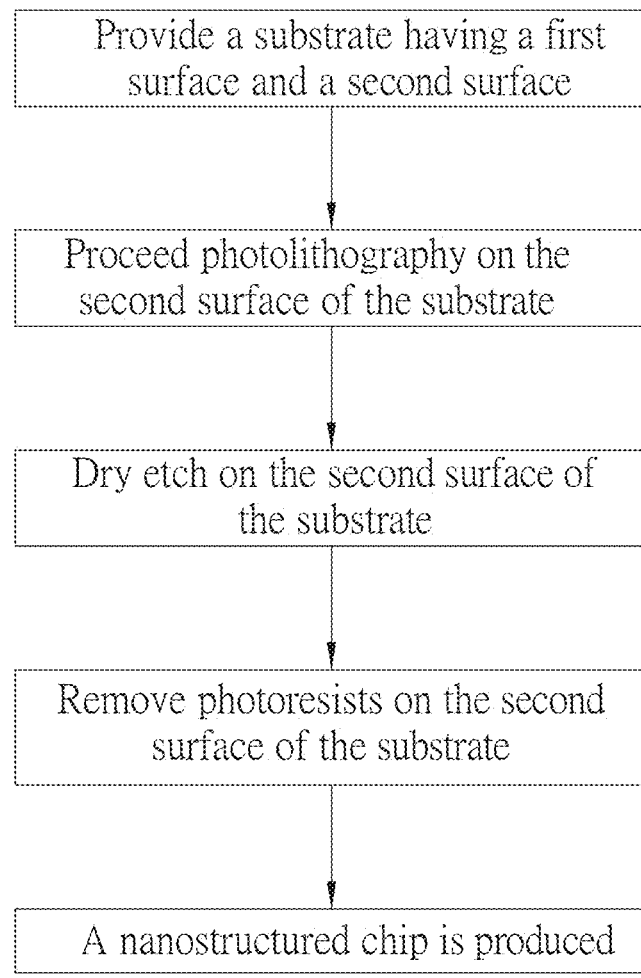
FIG. 10 is a flow chart of the method of producing a third preferred embodiment.

As shown in FIG. 10, the method of producing a third preferred embodiment including the step of proceeding photolithography on the second surface of the substrate. The photolithography step includes spreading a photoresist on the second surface of the substrate, and then exposing and developing to define a photoresist with nano-patterns. Next, dry etch on the region that is not covered by the photoresist, wherein the dry etching is performed by inductively coupled plasma (ICP). After dry etching, remove the photoresists and a nanostructured chip with a nanostructured layer is produced.

Figures 11, 12:
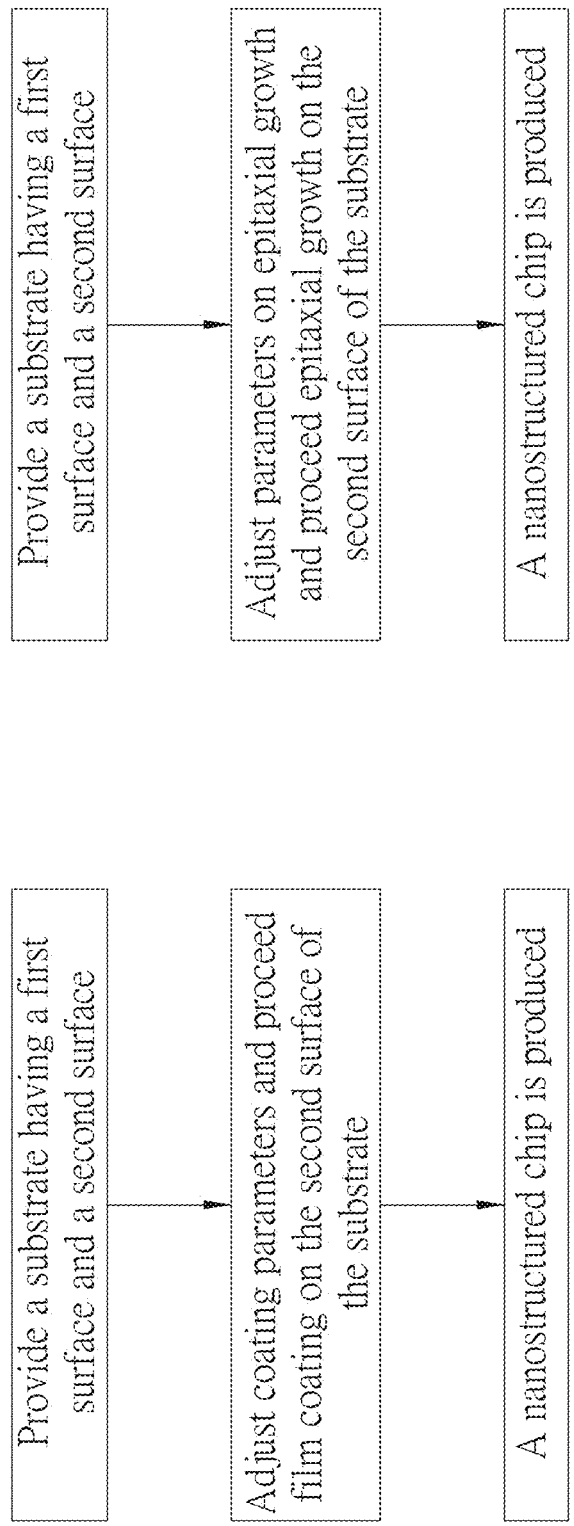
FIG. 11 is a flow chart of the method of producing a fourth preferred embodiment.
FIG. 12 is a flow chart of the method of producing a fifth preferred embodiment.

As shown in FIG. 11, the method of producing a fourth preferred embodiment including the step of adjusting parameters on epitaxial growth in molecular beam epitaxy, and proceeding epitaxial growth to form a 3D nanostructure on the second surface of the substrate.

As shown in FIG. 12, the method of producing a fifth preferred embodiment including the step of adjusting coating parameters, and proceeding film coating on the second surface of the substrate to form a 3D nanostructure and a nanostructured layer. In practice, the nanostructure is formed with physical and chemical film coating.

In conclusion, the nanostructured layer on the second surface or the lateral surface is helpful to effectively disperse the stress in the nanostructured chip to increase the flexural strength of the nanostructured chip, and to prevent the epitaxial layer from having cracks, bowings, or fragments in the following process due to the different thermal expansion coefficients between the epitaxial layer and the nanostructured chip, or the lattice constants of the substrate and the epitaxial layer are mismatched.

It must be pointed out that the embodiments described above are only some preferred embodiments of the present invention. All equivalent structures and methods which employ the concepts disclosed in this specification and the appended claims should fall within the scope of the present invention.

What is claimed is:
1. A nanostructured chip, which is adapted to have an epitaxial layer formed thereon, comprising:
   a substrate having a first surface and a second surface opposite to the first surface, wherein the nanostructured chip is adapted to have the epitaxial layer formed on the first surface; and a nanostructured layer formed on the second surface;
wherein an average flexural strength is at least 0.458 Gpa;
wherein the nanostructured layer comprises a plurality of nanopillars extending in a direction away from the substrate.

2. The nanostructured chip of claim 1, wherein the length of each of the plurality of nanopillars is between 10 and 10000 nm.

3. The nanostructured chip of claim 2, wherein the length of each of the plurality of nanopillars is not less than 4000 nm.

4. The nanostructured chip of claim 1, wherein the width of each of the plurality of nanopillars is between 10 and 10000 nm.

5. The nanostructured chip of claim 4, wherein the width of each of the plurality of nanopillars is less than 500 nm.

6. The nanostructured chip of claim 1, wherein axes of the plurality of nanopillars are in parallel.

7. The nanostructured chip of claim 1, wherein the plurality of nanopillars cover more than 50% of a total area of the second surface.

8. The nanostructured chip of claim 1, wherein the substrate further has a lateral surface connecting the first surface and the second surface; another nanostructured layer is formed on the lateral surface.

* * * * *